(12) United States Patent
Burgess et al.

(10) Patent No.: US 7,709,817 B2
(45) Date of Patent: May 4, 2010

(54) ION BEAMS IN AN ION IMPLANTER (75) Inventors: Christopher Burgess, East Sussex (GB); Martin Keane, East Sussex (GB)

(73) Assignee: Applied Materials, Inc., Santa Clara, CA (US)

( * ) Notice: Subject to any disclaimer, the term of this patent is extended or adjusted under 35 U.S.C. 154(b) by 154 days.

(21) Appl. No.: 11/806,849

(22) Filed: Jun. 4, 2007

(65) Prior Publication Data
US 2008/0061251 A1 Mar. 13, 2008

(30) Foreign Application Priority Data
Jun. 9, 2006 (GB) ................................. 0611460.7

(51) Int. Cl.
*G21K 5/04* (2006.01)

(52) U.S. Cl. ............................. 250/492.21; 250/492.22; 250/492.2; 702/127; 702/188; 702/189; 702/199

(58) Field of Classification Search ............ 250/492.21, 250/492.22, 492.2; 438/10; 702/127, 188, 702/189, 199
See application file for complete search history.

(56) References Cited

U.S. PATENT DOCUMENTS

| | | | | |
|---|---|---|---|---|
| 6,810,296 B2 * | 10/2004 | Bode et al. | ................... | 700/110 |
| 7,041,990 B2 * | 5/2006 | Kim et al. | ............... | 250/492.21 |
| 7,365,348 B2 * | 4/2008 | Gierak et al. | ............ | 250/493.1 |
| 7,397,047 B2 * | 7/2008 | Chang et al. | ........... | 250/492.21 |
| 7,399,980 B2 * | 7/2008 | Vanderberg et al. | .... | 250/492.21 |
| 7,547,460 B2 * | 6/2009 | Cucchetti et al. | ............... | 427/8 |
| 2003/0001111 A1 * | 1/2003 | Kim et al. | ............... | 250/492.21 |
| 2003/0042427 A1 * | 3/2003 | Sullivan et al. | ............. | 250/397 |
| 2004/0244692 A1 * | 12/2004 | Chen et al. | ............ | 118/723 CB |
| 2005/0092939 A1 * | 5/2005 | Coss et al. | ............. | 250/492.21 |
| 2005/0221514 A1 * | 10/2005 | Pasadyn et al. | ............... | 438/14 |

FOREIGN PATENT DOCUMENTS

| | | |
|---|---|---|
| EP | 0608639 | 8/1994 |
| JP | 05135729 | 6/1983 |
| JP | 63091949 | 4/1988 |

OTHER PUBLICATIONS

English Abstract of JP 5135729.
English Abstract of JP 63091949.

* cited by examiner

Primary Examiner—David A Vanore
Assistant Examiner—Michael J Logie
(74) Attorney, Agent, or Firm—Boult Wade Tennant (57) ABSTRACT

A method of tuning an ion beam in an ion implanter relative to, e.g., ion beam current, energy, size and shape, includes retrieving a set of parameters associated with operation of the ion implanter, at least some of which are stored in a dynamic database, configuring the ion implanter according to the retrieved set of parameters, to thereby provide an ion beam, optimizing the ion beam by varying one or more of the parameters, and updating the parameters stored in the dynamic database which changed during optimization.

19 Claims, 4 Drawing Sheets

ION BEAMS IN AN ION IMPLANTER

FIELD OF THE INVENTION

The present invention relates to a method of tuning an ion beam in an ion implanter.

BACKGROUND OF THE INVENTION

A contemplated application of the present invention is in an ion implanter that may be used in the manufacture of semiconductor devices or other materials. In such an application, semiconductor wafers are modified by implanting atoms of desired species into the body of the wafer, for example to form regions of varying conductivity.

Ion implanters are well known and generally conform to a common design as follows. An ion source generally comprises an arc chamber in which a plasma is generated. The plasma will contain ions of a desired species to be implanted. The conditions under which the ion source operates affects the plasma produced. For example, varying the operational parameters affecting the ion source may change the number of ions in the plasma, the composition of the ions in the plasma (e.g. by promoting cracking of molecules), and the energy of ions in the plasma.

An extraction lens assembly produces an electric field that extracts ions from the ion source and forms a mixed beam of ions. Only ions of a particular species are usually required for implantation in a wafer or other substrate, for example a particular dopant for implantation in a semiconductor wafer. The required ions are selected from the mixed ion beam using a mass-analysing magnet in association with a mass-resolving slit. By setting appropriate operational parameters on the mass-analysing magnet and the ion optics associated therewith, an ion beam containing almost exclusively the required ion species emerges from the mass-resolving slit.

This ion beam is transported to a process chamber where the ion beam is incident on a substrate held in place in the ion beam path by a substrate holder. The ions may be accelerated or decelerated and focused prior to implantation. Other ion optics may be included along the ion beam path to steer and shape the ion beam, and prevent loss of ion current from the ion beam.

The various parts are operated under the management of a controller, typically a suitably-programmed personal computer or the like. A more detailed description of an ion implanter can be found in U.S. Pat. No. 4,754,200.

Accordingly, there are many operational parameters associated with the ion implanter that influence the ion beam that reaches the wafer. In particular, control of these parameters is required to ensure a desired ion beam current, energy, size and shape. Moreover, any of these ion beam attributes may vary from implant recipe to implant recipe.

SUMMARY OF THE INVENTION

Against this background, and from a first aspect, the present invention resides in a method of tuning an ion beam in an ion implanter, wherein the ion beam is dependent upon a plurality of operational parameters of the ion implanter, the method comprising: retrieving a set of operational parameters at least some of which are stored in a dynamic database; configuring the ion implanter according to the retrieved set of operational parameters thereby to provide an ion beam; optimising the ion beam by varying one or more of the operational parameters; and updating the operational parameters stored in the dynamic database that changed during optimisation.

Thus, a dynamic database is provided that contains at least some of the operational parameters used to control the ion beam. Rather than the values of the operational parameters in the dynamic database being fixed, they are allowed to evolve after each optimisation. Advantageously, this means that the ion implanter adapts to changes in the ion implanter over time. In particular, the changes in the ion source caused by wear may be accommodated by allowing the operational parameters stored in the dynamic database to evolve to suit these changes. Updating the operational parameters stored in the dynamic database means that the values retrieved next time are likely to be closer to the optimum values and hence the time required for optimisation of the ion beam should be minimised.

Many different methods of updating the operational parameters in the dynamic database are contemplated. For example, the method may comprise updating the operational parameters that changed by replacing the values stored in the dynamic database with the values obtained at the end of the optimisation. Alternatively, the method may comprise updating the operational parameters that changed with rolling averages calculated using the values obtained for those operational parameters at the end of the optimisation. The use of a rolling average is advantageous as it allows the value of the operational parameter to change quickly at first but then to settle to an established value with only small further changes.

To safeguard against spurious results undesirably affecting the operational parameters stored in the dynamic database, the method may further comprise checking operational parameters that changed during optimisation to see whether they have changed beyond a predefined limit or by more than a predefined amount. If the optimised value or the change exceeds the respective limit, the optimised values may be discarded and the values of the operational parameters stored in the dynamic database left unchanged. If the optimised values remain within the predefined limit and/or have changed only within the predefined limit, the operational parameters may be updated as described above. The limit may be specified as an absolute limit or as a fractional limit.

However, in some situations it may be advantageous to use constant values of some or all operational parameters as a staring point for ion beam optimisation rather than using the evolving values stored in the dynamic database. As a result, the method may optionally further comprise retrieving at least one of the set of operational parameters from those stored in a principal database. If an operational parameter is stored in both the principal database and the dynamic database, the operational parameter is retrieved from the principal database in preference to the dynamic database.

The operational parameters retrieved from the principal database are preferably used as a starting point for the optimisation of the ion beam. Hence, the values of the operational parameters so retrieved is likely to be different at the end of optimisation. These optimised values are not used to update the values stored in the principal database: the values stored therein remain unchanged. However, the method may still comprise updating that operational parameter in the dynamic database using the optimised values.

Values must be generated to populate the principal database initially. This may be done by an operator manually inputting predetermined values. Alternatively, the values may be populated by optimising the ion beam and storing one or more of the optimised operational parameters in the principal database. Generally, this updating should e performed under the instruction of an operator, i.e. the operator selects which operational parameters to be populated with the optimised values.

The principal database and/or dynamic database may comprise a plurality of sets of operational parameters. Each set may be associated with a particular implant recipe. In this situation, the method may comprise retrieving a set of operational parameters associated with a particular implant recipe from that plurality of such sets. Hence, operational parameters may be stored and evolved that are tailored to a particular recipe. Both the dynamic database and the principal database may have a plurality of sets of operational parameters, each set corresponding to a particular recipe. Put another way, each recipe will have two sets of associated operational parameters, one stored in the dynamic database and the other stored in the principal database.

When a recipe is first created, it will not have databases to provide operational parameters. Optionally, when an implant recipe does not have an associated set of operational parameters or where one or more of the operational parameters are missing, the missing operational parameters may be retrieved from corresponding operational parameters stored in an initialisation database. The initialisation database may thus act as the ultimate starting point, i.e. a set of operational parameters to be used as the starting point when initialising a new recipe or even a new ion implanter. As a result, the initialisation database may contain only a single set of operational parameters for that ion implanter. However, it is currently preferred that the initialisation database contains a plurality of sets of operational parameters, each set corresponding to an ion species to be implanted.

The method may further comprise configuring the ion implanter according to the retrieved set of operational parameters thereby to provide an ion beam, optimising the ion beam by varying one or more of the operational parameters, and storing the missing operational parameters in the dynamic database as determined during optimisation.

Typically, the ion implanter will comprise an ion source to generate the ion beam that will gradually deteriorate with use. As such, the optimum operational parameters will change with use of the ion source. To accommodate these changes, the dynamic and/or principal database may store operational parameters associated with different ages of the ion source as a plurality of sets. The method may then comprise retrieving a set of operational parameters from one such set. The 'age' of the ion source may be quantified in a number of ways. Absolute age is one such way, albeit crude. It has been found more useful to use the total time for which the ion source has been operated or the total current delivered by the ion source. Most preferably, the method comprises retrieving a set of operational parameters from a plurality of such sets associated with the product of the age of the ion source and the total ion beam current delivered by the ion source.

Eventually, the ion source will need to be serviced or replaced. The method may comprise resetting the operational parameters stored in the dynamic database after the ion source has been changed or serviced. Preferably, the method may further comprise keeping the operational parameters stored in the dynamic database after the ion source has been serviced or replaced, and subsequently retrieving a set of operational parameters from the plurality of such sets associated with different ages of the ion source according to the age of the ion source since servicing or replacement.

The present invention also extends to a computer program comprising computer code instructions that, when executed, cause an ion implanter to operate in accordance with any of the above methods, and to a computer readable medium having recorded thereon such a computer program. In addition, the present invention extends to a controller configured to implement any of the above methods, and to an ion implanter including such a controller.

BRIEF DESCRIPTION OF THE DRAWINGS

In order that the present invention may be better understood, a preferred embodiment will now be described with reference to the accompanying drawings, in which.

DETAILED DESCRIPTION OF THE INVENTION

Figure 1:
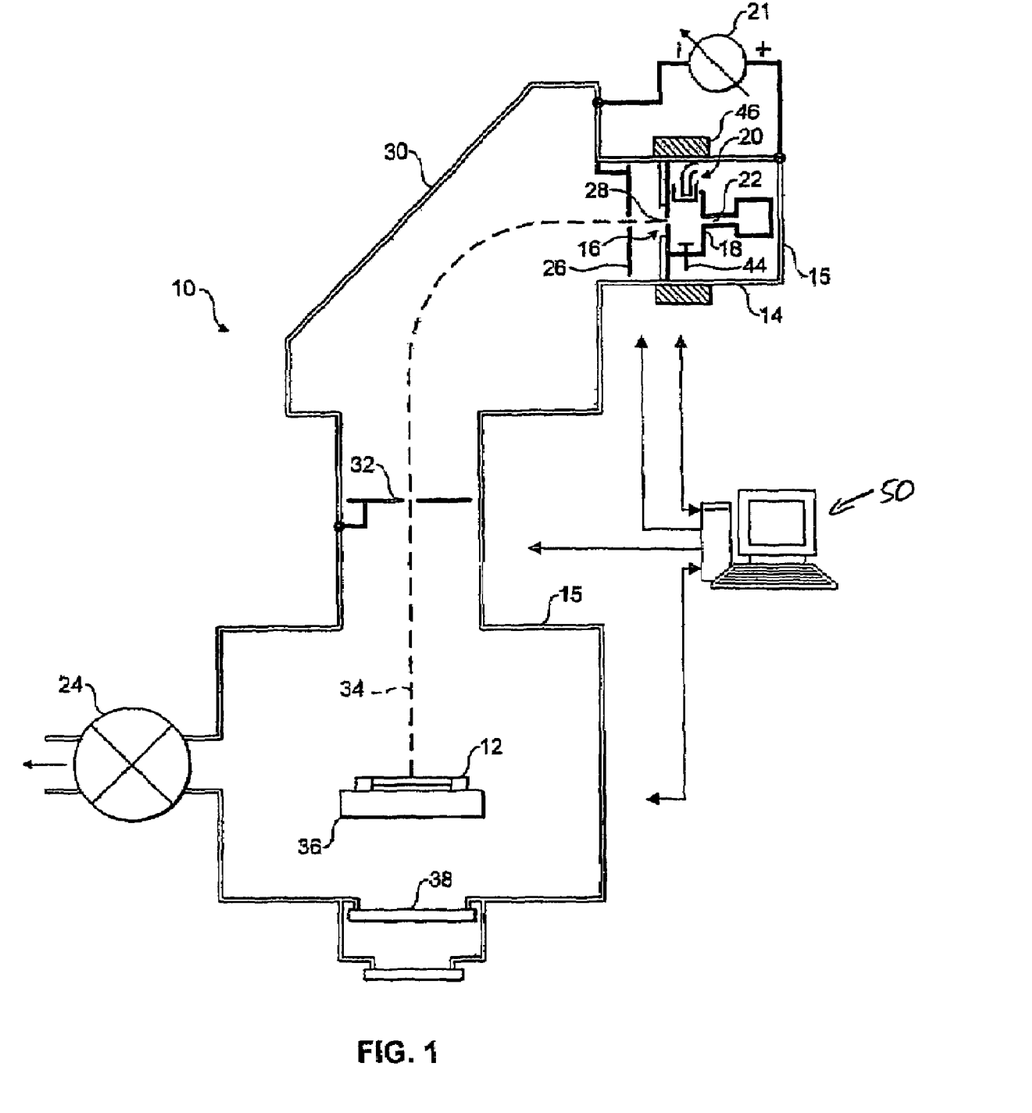
FIG. 1 is a schematic representation of an ion implanter with which the present invention may be used.

In order to provide a context for the present invention, an exemplary application is shown in FIG. 1, although it will be appreciated that this is merely an example of an application of the present invention and is in no way limiting.

FIG. 1 shows a known ion implanter 10 for implanting ions in semiconductor wafers 12 that may be used in accordance with the present invention. Ions are generated by an ion source 14 to be extracted by an extraction lens assembly 26 to form an ion beam. In this embodiment, this ion beam is steered and shaped through the ion implanter 10 such that the ion beam passes through a mass analysis stage 30. Ions of a desired mass are selected to pass through a mass-resolving slit 32 and then conveyed onward through the ion implanter 10 to be slowed and focused by an acceleration or deceleration lens assembly (not shown) and then to strike a semiconductor wafer 12.

The ion implanter 10 contains an ion source 14 for generating an ion beam of a desired species that is located within a vacuum chamber 15. The ion source 14 generally comprises an arc chamber 16 containing a cathode 20 located at one end thereof. The ion source 14 may be operated such that an anode is provided by the walls 18 of the arc chamber 16. The cathode 20 is heated sufficiently to generate thermal electrons.

Thermal electrons emitted by the cathode 20 are attracted to the anode, the adjacent chamber walls 18 in this case. The thermal electrons ionise gas molecules as they traverse the arc chamber 16, thereby forming a plasma and generating the desired ions.

The path followed by the thermal electrons may be controlled to prevent the electrons merely following the shortest path to the chamber walls 18. A magnet assembly 46 provides a magnetic field extending through the arc chamber 16 such that thermal electrons follow a spiral path along the length of the arc chamber 16 towards a counter-cathode 44 located at the opposite end of the arc chamber 16.

A gas feed 22 fills the arc chamber 16 with the species to be implanted or with a precursor gas species. The arc chamber 16 is held at a reduced pressure within the vacuum chamber 15. The thermal electrons travelling through the arc chamber 16 ionise the gas molecules present in the arc chamber 16 and may also crack molecules. The ions created in the plasma will also contain trace amounts of contaminant ions (e.g. generated from the material of the chamber walls).

Ions from within the arc chamber 16 are extracted through an exit aperture 28 provided in a front plate 27 of the arc chamber 16 using a negatively-biased (relative to ground) extraction electrode 26. A potential difference is applied between the ion source 14 and the following mass analysis stage 30 by a power supply 21 to accelerate extracted ions, the ion source 14 and mass analysis stage 30 being electrically isolated from each other by an insulator (not shown). The mixture of extracted ions are then passed through the mass analysis stage 30 so that they pass around a curved path under the influence of a magnetic field. The radius of curvature traveled by any ion is determined by its mass, charge state and energy and the magnetic field is controlled so that, for a set beam energy, only those ions with a desired mass to charge ratio and energy exit along a path coincident with the mass-resolving slit 32. The emergent ion beam is then transported to the target, i.e. the substrate wafer 12 to be implanted or a beam stop 38 when there is no wafer 12 in the target position. In other modes, the beam may also be accelerated or decelerated using a lens assembly positioned between the mass analysis stage 30 and the target position.

The semiconductor wafer 12 will be mounted on a wafer holder 36, wafers 12 being successively transferred to and from the wafer holder 36 for serial implantation. Alternatively, parallel processing may be used where many wafers 12 are positioned on a carousel 36 that rotates to present the wafers 12 to the incident ion beam in turn.

A controller is shown at 50 that comprises a computer. The controller 50 is provided with software for managing operation of the ion implanter 10. The above ion implanter 10 may be used to perform various implants under the control of the controller 50. Even within the field of semiconductor wafer doping, there are endless variations on implants. Each implant has an associated recipe that will include values for the operational parameters to be applied to the ion implanter 10 by the controller 50. Many operational parameters may be varied, for example the wafer to be doped; the species to be implanted; how the species is delivered (e.g. boron may be delivered as a beam of B, BF, $BF_2$ ions); the depth and angle of implant; and the energy, shape and size of the ion beam.

Hence, the controller 50 stores details of the operational parameters to be used for the different recipes in an associated memory. These operational parameters represent a good starting point for establishing a suitable ion beam to be used for the implant. However, implants are affected by changes in the ion implanter over time. Accordingly, while the operational parameters stored in the memory are used as a starting point, the ion beam is then optimised by varying the values of the operational parameters and monitoring the results.

The operational parameters for each implant are stored in the memory as a series of files, organised into databases as follows.

Figure 2:
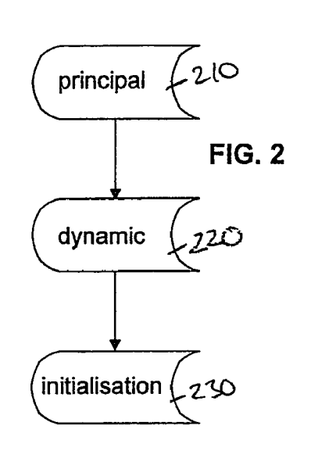
FIG. 2 is a schematic diagram to illustrate the hierarchy between operational parameters stored in the principal settings database, the dynamic settings database and the initialisation settings database.

The memory holds three databases, the principal database 210, the dynamic database 220 and the initialisation database 230, as shown in FIG. 2. The principal database 210 and the dynamic database 220 are organised into files, each file corresponding to a particular recipe. The initialisation database 230 is organised at a higher level than recipes, and so comprises a series of files according to the species to be implanted. The reason for this will be explained below.

In its broadest sense, the present invention requires only the dynamic database 220. In this case, the operational values are retrieved from the file stored for a particular recipe in the dynamic database 220, and the values are used as a starting point for optimisation. As the name suggests, the dynamic database 220 evolves with time. This is because the values of the operational parameters stored therein are updated each time a recipe is used to reflect changes between the previous values stored and the values found during optimisation of the ion beam. As these values are expected to drift over time, each file is divided into a series of bins to cover successive ranges corresponding to use of the ion source 14.

In particular, the optimum operational parameters are expected to drift over time as the ion source 14 ages. In its simplest form, the bins may be assigned to the age of the ion source 14. More usefully, it is the use of the ion source 14 that should be reflected, and so the bins may be divided to cover ranges corresponding to the time the ion source 14 has been operated or the total beam current delivered by the ion source 14. However, it preferred to divide the bins to cover ranges corresponding to the product of the operational time and the beam current as mAhours. Each bin contains a full set of operational parameters. The bins are gradually populated with values for the operational parameters as the ion source 14 is used during its lifetime. Advantageously, when an ion source 14 wears out and is serviced or replaced, a set of operational parameters exist already for that recipe that may be retrieved from the appropriate bin as the new ion source ages.

In certain situations, it may not be best to use the evolving values for one or more operational parameters stored in the dynamic database 220 as the starting point for optimisation. Instead, it may be better to force a preset value as the starting point for those operational parameters. This may be, for example, because it has been found that the best implants may result when an operational parameter is close to a particular value. However, as will be appreciated, the ion implanter effectively teaches itself how to perform the implant by evolving the values of the operational parameters in the dynamic database 220 as a result of an optimisation routine that effectively searches for the optimal values by varying them in turn. Often, the search space will comprise local optima as well as the optimum, and forcing the value of an operational parameter may be a way of stopping the dynamic database 220 from evolving to follow one of the local optima.

As a result, the memory stores a file for each recipe in the principal database 210. The principal database 210 has values for operational parameters entered only at the request of an operator, i.e. the values are never updated automatically after optimising the ion beam. The operator has complete control over which, if any, operational parameters will have values entered in the principal database 210. Any particular file is likely to have only a few of the available operational parameters provided with values, and many operational parameters will be missing. Where a value is provided for an operational parameter in the principal database 210, this value is used in preference to a corresponding value stored in the dynamic database 220.

The file for each recipe stored in the principal database 210 may also be divided into a series of bins according to the age of the ion source 14, akin to the file structure in the dynamic database 220. Alternatively, only a single set of operational parameters may be stored in the principal database 210 for each recipe.

It will be realised that the above applies to ongoing use of the ion implanter 10, but that the dynamic database 220 must first be populated with values for the operational parameters. In addition, values may also be required for populating the principal database 210. To overcome this problem, ion implanters 10 are supplied with sets of operational parameters stored in the initialisation database 230. So, to initialise a new recipe, these operational parameters are used to establish an ion beam which is then optimised to achieve the desired implant. Once this optimisation has been completed for the first time, the resulting values of the operational parameters may be copied to a file created in the dynamic database 220 for that recipe.

The values stored in the initialisation database 230 may be varied by an operator, but are not updated automatically following optimisation. They are similar to the values stored in the principal database 210 in this respect.

The optimisation database 230 may contain only a single file containing a single set of operational parameters for that ion implanter 10. However, it is preferred for the initialisation database 230 to hold a series of files, each file corresponding to a particular ion species to be implanted. Hence, the appropriate file may be consulted according to the ion species specified when the new recipe is being initialised.

FIG. 2 shows the hierarchy of databases consulted by the controller 50 when setting up the ion implanter 10 to implement a recipe. As a summary, the controller 50 turns first to the file stored in the principal database 210 for the selected recipe. The controller retrieves whatever operational parameters are stored therein. The controller 50 then turns to the file stored in the dynamic database 220 for that recipe. The controller 50 retrieves only those operational parameters that were missing from the principal database 210. In most situations, all operational parameters will now be retrieved. If any are missing, or if a new recipe is being initialised, the controller retrieves the missing operational parameters from the file stored in the initialisation database 230 for the species to be implanted according to the recipe.

In terms of data entry into the databases 210, 220 and 230, the following holds. The initialisation database 230 is populated at the factory prior to delivery of the ion implanter 10. The principal database 210 is populated only under the guidance of an operator. The dynamic database 220 is first populated copying the values in the initialisation database 230 as a starting point, and is then updated after each optimisation. As such, the dynamic database 220 is the only database that is updated automatically.

Figure 3:
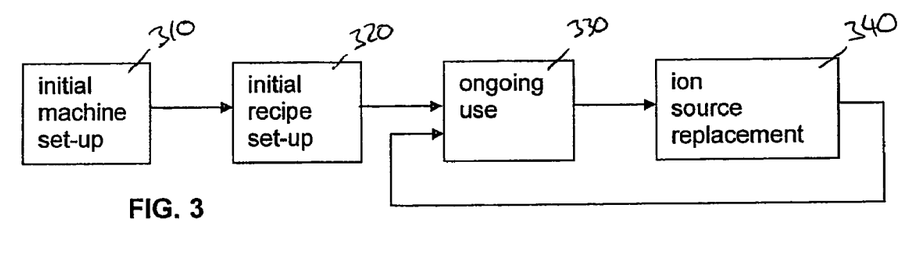
FIG. 3 is a schematic diagram showing various stages in the use of an ion implanter from initial set-up of the ion implanter through to ongoing use.

Ion implanters 10 such as the one described above are generally manufactured, tested before leaving the factory, shipped to the customer, and then commissioned at the customer's facility. FIG. 3 shows this initial commissioning and subsequent use of the ion implanter 10.

At 310, the ion implanter 10 undergoes initial set-up to ensure that it is functioning correctly. Recipes may then be created at 320 and operational parameters for those recipes established and stored in the principal database 210 and the dynamic database 220. The ion implanter 10 is then ready for ongoing use at 330. At some point, the ion source 14 is likely to wear out and so need replacing at 340. After the ion source 14 has been serviced or replaced, the ion implanter 10 may resume ongoing use at 330.

Figure 4:
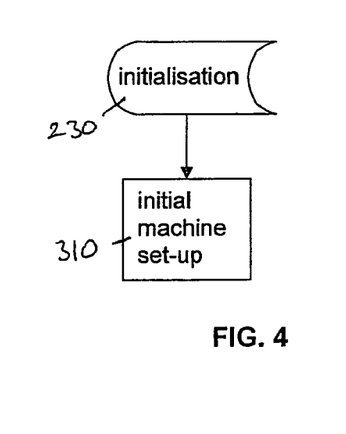
FIG. 4 is a schematic diagram showing the data flow of operational parameters during the step of initial ion implanter set-up of FIG. 3.

FIG. 4 shows the data flow during the initial machine set-up 310 of FIG. 3. During initial machine set-up 310, the operational parameters stored in the initialisation database 230 are retrieved and applied to the ion implanter 10. The ion implanter 10 is then tested to ensure correct operation based on these operational parameters.

Figure 5:
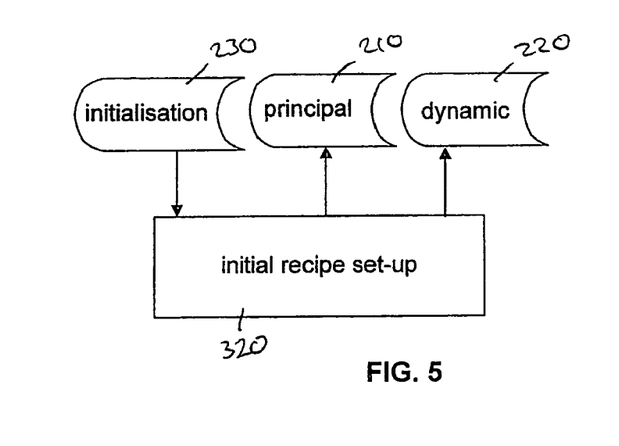
FIG. 5 is a schematic diagram showing the data flow of operational parameters during the step of initial implant recipe set-up of FIG. 3.

FIG. 5 shows the data flow during the initial recipe set-up 320 of FIG. 3. When a new recipe is created, the operational parameters from the initialisation database 230 are retrieved and applied to the ion implanter 10. The ion implanter 10 is then tested and optimised for implementing that recipe. The operational parameters so derived are stored in the dynamic database 220 and, if desired, values may be entered by an operator into the principal database 210.

Figure 6:
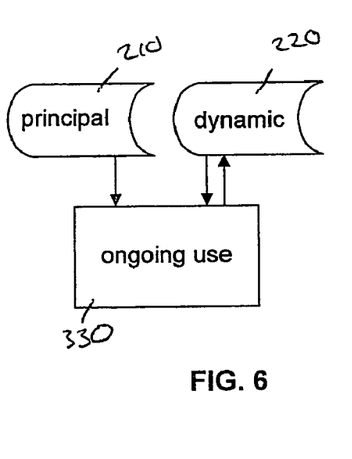
FIG. 6 is a schematic diagram showing the data flow of operational parameters during the step of ongoing use of FIG. 3.

FIG. 6 shows the data flow during ongoing use of the ion implanter shown at 330 of FIG. 3. Here, a recipe is selected and the controller 50 retrieves operational parameters preferentially from the principal database 210 and then retrieves any missing operational parameters from the dynamic database 220. Should any operational parameters be missing from both the principal database 210 and the dynamic database 220 for any reason, the controller 50 retrieves corresponding values from the initialisation database 230. The ion beam is then optimised and any operational parameters that have changed are updated in the dynamic database 220. Values stored in the principal database 210 may be updated if desired. New recipes may need to be created from time to time during ongoing use of the ion implanter 10. In these situations, the procedure described above with reference to FIG. 5 is used.

Figure 7:
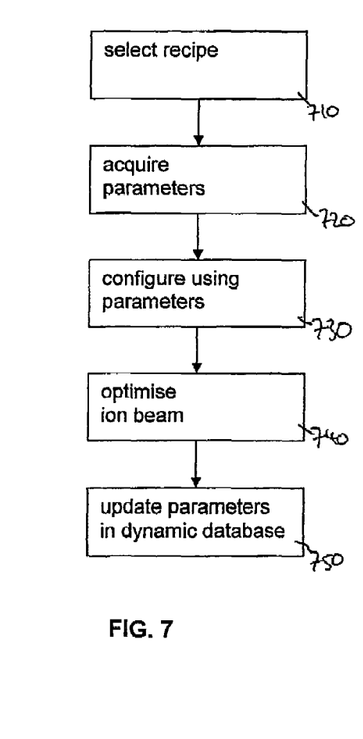
FIG. 7 is a schematic diagram showing how an ion implanter is prepared for an implant according to a recipe.

FIG. 7 shows a method followed during ongoing use 330 of the ion implanter 10 when a change in recipe is required. At 710, the next recipe to be used is selected. This is most conveniently performed by an operator using the controller 50 or through factory automation. For example, a factory may implement a schedule such that the controller 50 proceeds through a series of assigned implants, selecting recipes as required.

With the next recipe selected, the controller 50 retrieves the operational parameters for that recipe at 720. At 730, the controller 50 configures the ion implanter 10 using the retrieved operational parameters to provide an ion beam. The ion beam is optimised at 740, and at 750 the operational parameters are updated in the dynamic database 220. Each of steps 720 to 740 will now be described in more detail with reference to FIGS. 8 to 10.

Figure 8:
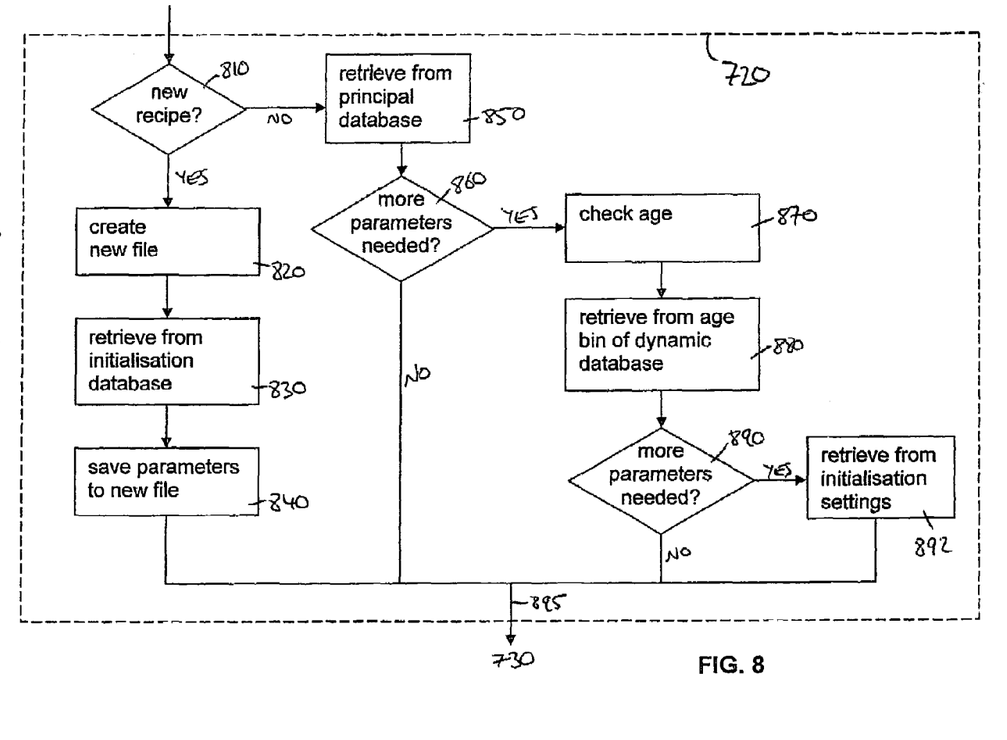
FIG. 8 is a schematic diagram showing in more detail the step of acquiring operational parameters of FIG. 7.

FIG. 8 shows a method used when acquiring operational parameters 720. At 810, the method the controller 50 follows is dependent upon whether the recipe is new. If a new recipe is being initialised, the controller 50 creates a new file for that recipe in the principal database 210 and in the dynamic database 220 at 820. The controller 50 then retrieves operational parameters from the initialisation settings database 230 at 830. As well as retrieving these operational parameters, the controller 50 also saves these parameters into the dynamic database 220 at 840.

If an existing recipe is selected, the controller 50 first turns to the file saved for that recipe in the principal database 210 and retrieves whatever operational parameters are stored therein at 850. The principal database 210 is likely to provide only a small fraction of the necessary operational parameters. Nonetheless, the controller 50 then determines whether more operational parameters need to be retrieved at 860. If not, the controller 50 may merely continue to the next stage of configuring the ion implanter 10 at 730.

If more operational parameters are required, the controller 50 turns to the dynamic database 220. To retrieve the correct set of operational parameters, the controller 50 must determine the age of the ion source 14 at 870. In this embodiment, the product of the time the ion source 14 has been operating and the current delivered by the ion source 14 is used as a measure of the age of the ion source 14. With this product determined, the controller 50 retrieves the missing operational parameters from the appropriate bin of the recipe's file in the dynamic database 220. If the ion source 14 has aged such that an empty new bin is found, the values from a previous bin may be used and copied to the new bin. If a recipe is not used for a long period of time, one or bins may be left empty. In this case, the last bin having a value stored therein is used. After optimisation at 740, the values stored in the new bin will be updated and the values in the previous bin will remain unchanged.

With further operational parameters retrieved from the dynamic database 220, the controller 50 checks to ensure all operational parameters have been retrieved at 890. If, as expected, all operational parameters have been retrieved the controller 50 may continue to the next stage of configuring the ion implanter at 730. Should one or more operational parameters be missing, the controller 50 retrieves these parameters from the initialisation database 230 at 892.

Whichever method of retrieving the operational parameters is used, a set of operational parameters for that recipe is provided at 895 in FIG. 8.

Figure 9:
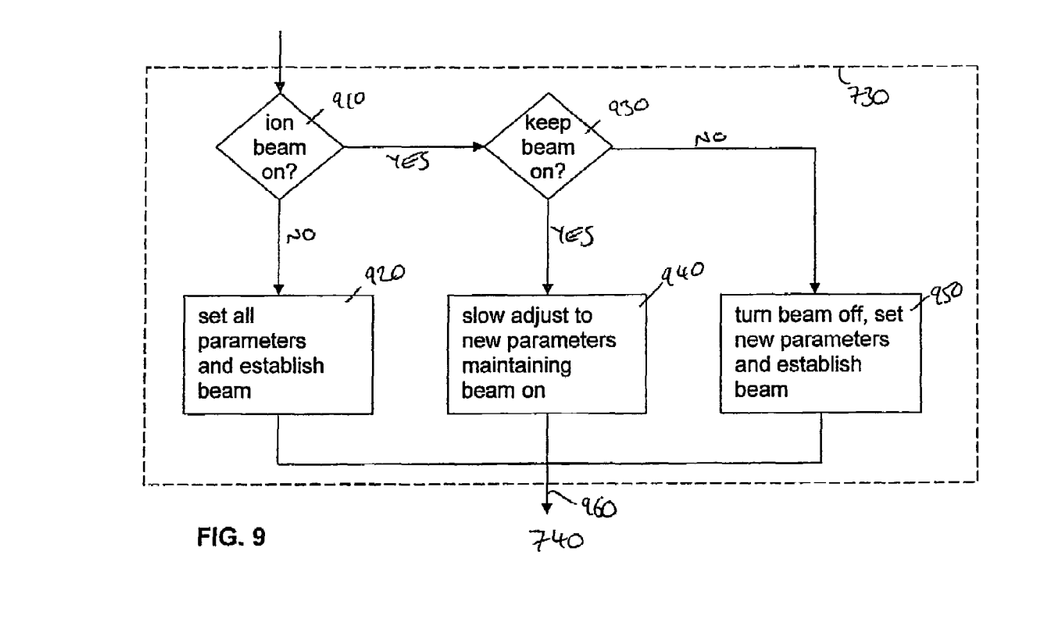
FIG. 9 is a schematic diagram showing in more detail the step of configuring the ion implanter of FIG. 7.

FIG. 9 shows a method for configuring the ion implanter 10 using the operational parameters retrieved at step 720. How the controller 50 proceeds depends upon whether or not an ion beam is already established, as indicated at 910. If not, the controller 50 at 920 merely applies all operational parameters to the ion implanter 10 and so establishes an ion beam.

If an ion beam is already established, the controller 50 at 930 refers to a flag set or prompts the operator to determine whether a slow change that maintains the ion beam or a fast change that loses the ion beam is required. If the ion beam is to be maintained, the controller 50 at 940 slowly adjusts the ion implanter 10 to adopt the new operational parameters from those already in use. For a fast change, at 950 the ion beam is merely dumped by turning off the extraction electrode assembly 26, the new operational parameters are implemented and the ion beam established once more. However implemented, the method provides an ion beam at 960 conforming to that produced by the operational parameters stored for that recipe.

Figure 10:
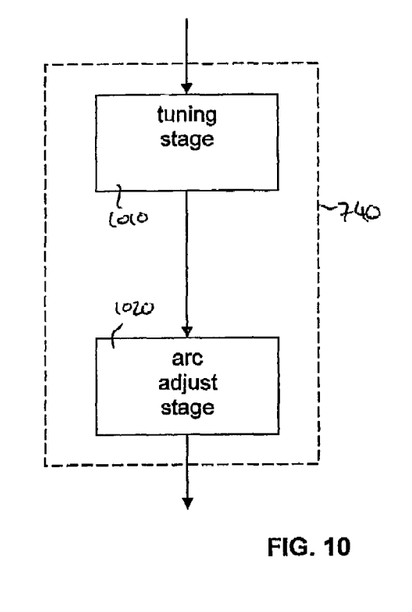
FIG. 10 is a schematic diagram showing in more detail the step of optimising the ion beam of FIG. 7.

The controller 50 then optimises the ion beam, as shown in FIG. 10. This process comprises a first, tuning stage at 1010 and a second, arc adjust stage at 1020. During the tuning stage 1010, the operational parameters relating to the ion beam extraction and steering are investigated by their systematic adjustment and through monitoring the consequent results; for example extraction element gaps, lateral positions, extraction voltages or mass analysis are varied in turn and the resulting change in ion beam current monitored. Each recipe will specify a desired ion beam current. Hence optimisation will first try to meet this ion beam current requirement and, if ion beam current is delivered, try to optimise the settings needed to deliver that current (e.g. by minimising arc voltage to preserve the arc chamber). During the arc adjust stage 1020, the ion beam is optimised by systematically varying the operational parameters relating to the plasma density.

As described above, the optimisation routine effectively performs a search for the optimum conditions through systematic variation of the operational parameters. As with such methods, there is always a danger that the search will lead to a local optima being found rather than the ultimate optimum. Various strategies may be implemented to mitigate this risk, as is well known in the art. For example, the use of values in the principal database 210 and the use of thresholds when looking to update values in the dynamic database 220 may be used to constrain values stored in the databases 210 and 220.

Once ion beam optimisation at 740 has been completed, the optimised values of the operational parameters are checked against the old values stored in the dynamic database 220 to see if they have changed. This is true even for operational parameters that were originally retrieved from the principal database 210: their corresponding values in the dynamic database are updated at the end of the optimisation at 740 if they have changed.

Once the operational parameters that have changed have been identified, they are checked against thresholds stored by the controller 50. Although the thresholds may correspond to absolute values (to constrain the optimisation search as described immediately above), to absolute amounts of difference, to fractional differences or to combinations. The use of absolute limits to the new value and fractional limits to the difference are preferred. For the latter, the change in an operational parameter between the optimised value and the old value is checked to see if it is within the threshold amount, e.g. ±20%. If outside this range, the optimised value is discarded and the operational parameter remains unchanged. If within this threshold, the old value of the operational parameter is updated. Updating may simply comprise replacing the old value with the optimised value, but the use of a rolling average is preferred in this embodiment. The rolling average is calculated as:

$$\frac{(old\_value \times no\_of\_samples) + optimised\_value}{no\_of\_samples + 1}$$

Hence, a count of the number of optimised values sampled is kept by the controller 50. Using this count ensures that the value of the operational parameter changes rapidly at first but then settles to a value with only small further changes. This stored count may be reset whenever the ion source 14 is replaced or serviced.

The above describes a mode of operation of the ion implanter 10 where the operational parameters are updated, referred to as 'on and learning'. In addition, two further modes are provided. The first extra additional mode corresponds to 'off' where the dynamic database 220 is not used. In this mode, the principal database 210 is used, with any missing operational parameters being provided by the initialisation database 230. Hence, in FIG. 8, the arrow from step 860 would extend direct to step 892. In the second additional mode, referred to as 'on', the operational parameters stored in the dynamic database 220 are used but are not updated after optimising the ion beam at 740. Hence, step 750 is omitted from FIG. 7.

As will be appreciated by the person skilled in the art, variations may be made to the above embodiment without departing from the scope of the invention defined by the claims.

The invention claimed is:

1. A method of tuning an ion beam in an ion implanter, wherein the ion beam is dependent upon a plurality of operational parameters of the ion implanter, the method comprising:

retrieving a set of operational parameters at least some of which are stored in a dynamic database;

configuring the ion implanter according to the retrieved set of operational parameters thereby to provide an ion beam;

optimizing the ion beam by varying one or more of the operational parameters; and updating the operational parameters stored in the dynamic database that changed during optimization with rolling averages calculated using the values obtained for those operational parameters at the end of the optimization.

2. The method of claim 1, comprising updating the operational parameters only if a particular operational parameter changed within a predefined limit.

3. The method of claim 2, comprising updating the operational parameters only if a particular operational parameter changed by less than a predefined fraction.

4. The method of claim 1, comprising retrieving at least one of the set of operational parameters from those stored in a principal database.

5. The method of claim 4, wherein, if an operational parameter is stored in both the principal database and the dynamic database, the method comprises retrieving the operational parameter from the principal database in preference to the dynamic database.

6. The method of claim 4, comprising optimising the ion beam by varying one or more of the operational parameters and storing one or more operational parameters so established in the principal database.

7. The method of claim 4, wherein, even if an operational parameter that changed during optimisation was retrieved from the principal database, the method comprises updating that operational parameter stored in the dynamic database.

8. The method of claim 1, comprising retrieving a set of operational parameters associated with a particular implant recipe from a plurality of such sets associated with different implant recipes.

9. The method of claim 8 comprising, when an implant recipe does not have an associated set of operational parameters, retrieving a set of operational parameters stored in an initialisation database, configuring the ion implanter according to the retrieved set of operational parameters thereby to provide an ion beam, optimising the ion beam by varying one or more of the operational parameters, and storing the operational parameters in the dynamic database as determined during optimisation.

10. The method of claim 1, further comprising using an ion source of the ion implanter to generate the ion beam.

11. The method of claim 10, comprising retrieving a set of operational parameters from a plurality of such sets associated with different ages of the ion source.

12. The method of claim 11, comprising retrieving a set of operational parameters from a plurality of such sets associated with total ion beam current delivered by the ion source.

13. The method of claim 11, comprising retrieving a set of operational parameters from a plurality of such sets associated with the product of the age of the ion source and the total ion beam current delivered by the ion source.

14. The method of claim 11, further comprising resetting the operational parameters stored in the dynamic database after the ion source has been serviced or replaced.

15. The method of claim 11, further comprising keeping the operational parameters stored in the dynamic database after the ion source has been serviced or replaced, and subsequently retrieving a set of operational parameters from the plurality of such sets associated with different ages of the ion source according to the age of the ion source since servicing or replacement.

16. An ion implanter and a computer program comprising computer code instructions that, when executed, cause the ion implanter to operate in accordance with the method of claim 1.

17. A programmable controller arranged to retrieve from memory the computer program of claim 16 and to execute the computer program.

18. An ion implanter and a computer readable medium having recorded thereon a computer program that, when executed, causes the ion implanter to operate according to the method of claim 1.

19. An ion implanter comprising a controller configured to implement the method of claim 1.

* * * * *